United States Patent [19]

Ipri et al.

[11] Patent Number: 4,513,397
[45] Date of Patent: Apr. 23, 1985

[54] ELECTRICALLY ALTERABLE, NONVOLATILE FLOATING GATE MEMORY DEVICE

[75] Inventors: Alfred C. Ipri, Princeton; Roger G. Stewart, Neshanic Station, both of N.J.

[73] Assignee: RCA Corporation, Princeton, N.J.

[21] Appl. No.: 448,690

[22] Filed: Dec. 10, 1982

[51] Int. Cl.³ .............................................. G11C 11/40
[52] U.S. Cl. .................................... 365/185; 357/23.5
[58] Field of Search ................. 365/185; 357/23 VT

[56] References Cited

U.S. PATENT DOCUMENTS

| 3,500,142 | 3/1970 | Kahng | 317/235 |
| 3,660,819 | 5/1972 | Frohman-Bentchkowski | 317/235 |
| 4,328,565 | 5/1982 | Harari | 365/185 |
| 4,355,375 | 10/1982 | Arakawa | 365/185 |
| 4,417,264 | 11/1983 | Angle | 365/185 |

FOREIGN PATENT DOCUMENTS 0045578  10/1982  European Pat. Off. .

OTHER PUBLICATIONS

"16-K EE-PROM Relies on Tunneling for Byte-Erasable Program Storage", W. S. Johnson, et al., *Electronics*, Feb. 28, 1980, pp. 113–117.
IBM Technical Disclosure Bulletin–vol. 23, No. 2, Jul. 1980; pp. 543–545.

*Primary Examiner*—James W. Moffitt
*Attorney, Agent, or Firm*—Birgit E. Morris; Donald S. Cohen; Lawrence P. Benjamin

[57] ABSTRACT

An electrically alterable, nonvolatile floating gate memory device is described wherein the floating gate is a second level polysilicon layer. The first level polysilicon layer is provided with an aperture in order for only a small portion of the second level polysilicon floating gate to extend through the aperture for coupling to the substrate. Chip area is conserved by coupling the floating gate to the substrate at the portion of the channel region that conduction takes place by means of the self aligned aperture.

10 Claims, 4 Drawing Figures

ELECTRICALLY ALTERABLE, NONVOLATILE FLOATING GATE MEMORY DEVICE

BACKGROUND OF THE INVENTION

This invention relates, in general, to semiconductor memory devices and more particularly, to electrically alterable, nonvolatile floating gate memory devices.

The microprocessor based systems, as well as the related arts, have long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, they have inherent shortcomings that are overcome by the subject invention.

One such device resides in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the device which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is formed by first applying a thin insulating layer followed by a conductive layer (the floating gate) followed by a second insulating layer in order to completely surround the floating gate and insulate it from the remainder of the device. A second conductive layer (usually referred to as the control gate) is formed over the second insulating layer (in the region of the floating gate) to complete the gate structure. Such devices are exemplified in U.S. Pat. No. 3,500,142 which issued to D. Kahng on Mar. 10, 1970 and U.S. Pat. No. 3,660,819 which issued to D. Frohman-Bentchkowsky on May 2, 1972.

The major drawback of these prior art devices resides in the fact that high fields are required to produce the necessary avalanche breakdown in order for charge to be placed on the floating gate. Further, to erase charge placed on the floating gate, the entire device must be provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In the recent years, the art has progressed to the point where nonvolatile, floating gate read only memory devices have been produced which are electrically alterable. One such memory cell has been described in detail in an article entitled "16-K EE²PROM Relies on Tunneling for Byte-Erasable Program Storage" by W. S. Johnson, et al., ELECTRONICS, Feb. 28, 1980, pp. 113–117. In this article the authors describe a "Floating-Gate Tunnel Oxide" structure wherein a cell using a polycrystalline silicon (polysilicon) floating gate structure has its gate member charged with electrons (or holes) through a thin oxide layer positioned between the floating gate and the substrate by means of the Fowler-Nordheim tunneling mechanism. An elevation view of a typical device is described, and shown in FIG. 1 of the article, wherein the floating gate member represents the first polysilicon level. By using this type of structure (a structure wherein the first level polysilicon represents the floating gate since it is closest to the substrate, and is covered by a second polysilicon level) an excessively high floating gate-to-substrate capacitance is produced. However, acceptably low "write" and "erase" operations can only be achieved when most of the applied voltage appears across the tunnel region which requires that the floating gate-to-control gate (second polysilicon level) capacitance be larger than the floating gate-to-substrate capacitance. Further, to achieve the required distribution of capacitance to produce the acceptable "write" and "erase" characteristics, the prior art has resorted to extending both the first and second polysilicon levels over the adjacent field oxide to obtain the additional capacitance. The net result is an undesirably large cell.

In a recent application, filed in the U.S. Patent and Trademark Office on Oct. 18, 1982, Ser. No. 437,271, now abandoned entitled "AN ELECTRICALLY ALTERABLE, NONVOLATILE FLOATING GATE MEMORY DEVICE", and assigned to the same assignee as the subject application, there is described a novel configuration of floating gate memory device wherein the floating gate is a second level polysilicon rather than the traditional first level polysilicon. This is done in order that the second level polysilicon floating gate be provided with a shield. The first level polysilicon is provided with an aperture and the second level floating gate is made to extend through the aperture so that only a relatively small area of the second level floating gate is coupled to the substrate. By providing such a structure it was found that the otherwise high floating gate-to-substrate capacitance was reduced. In order to accomplish these ends, the copending application provides a dual section portion, extending from the source region, to create an auxiliary channel region for "erasing" and "writing" into the resultant cell.

SUMMARY OF THE INVENTION

In the subject application, the polysilicon floating gate is a second level polysilicon layer rather than the prior art first level in order to provide a structure wherein the second level polysilicon floating gate is shielded from the substrate by the first level polysilicon (the program or control gate.) The first level polysilicon is provided with an aperture and a small portion of the second level polysilicon (floating gate) extends through the aperture so that only a relatively small area of the second level polysilicon is coupled to the substrate.

However, in order to conserve chip area to increase chip density (the number of devices in a given area), the subject application provides a novel structure which eliminates the dual section extended portion of the copending application and instead couples the floating gate to the substrate at the channel region by means of a self-aligned window.

DETAILED DESCRIPTION OF THE PREFERRED EMBODIMENT

Figure 1:
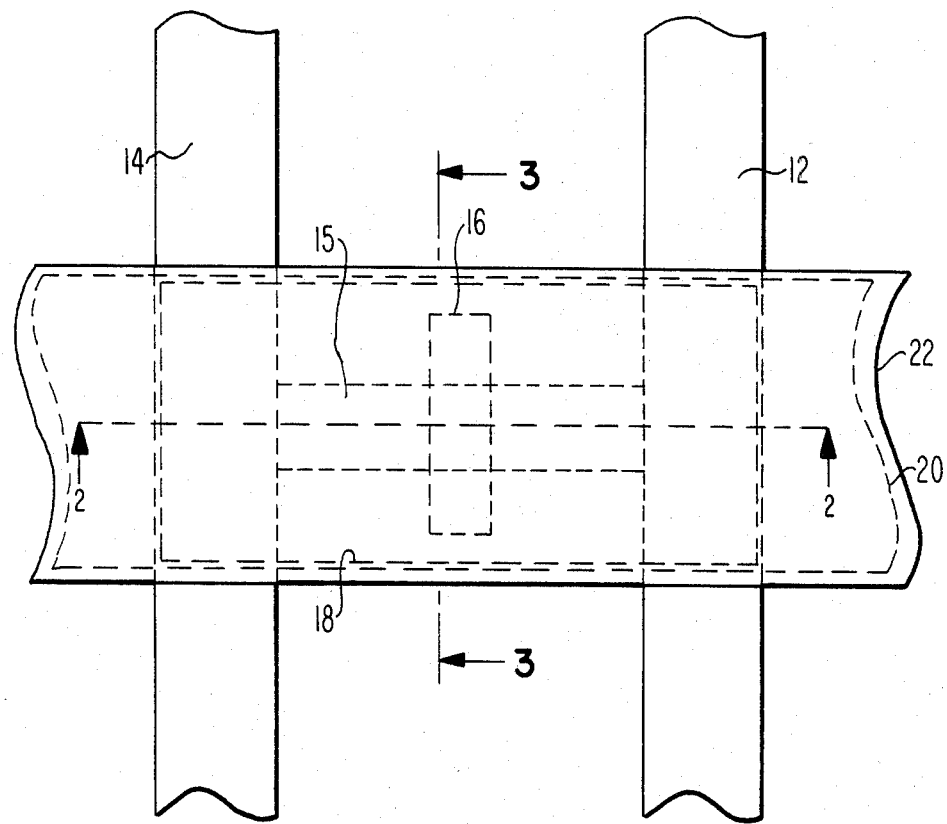
FIG. 1 is a plan view of an electrically alterable, nonvolatile floating gate memory device made in accordance with the teachings of our invention.
Figure 2:
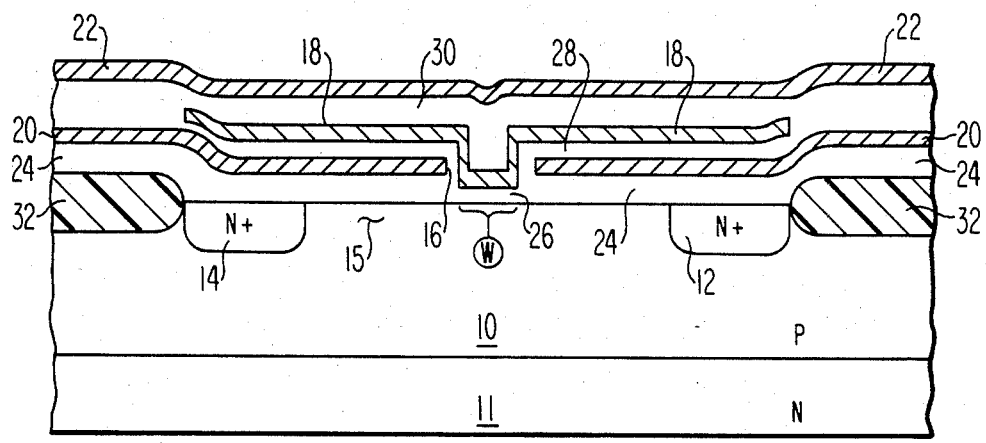
FIG. 2 is a cross-sectional, elevation view of our novel memory device taken along line 2—2 of FIG. 1.
Figure 3:
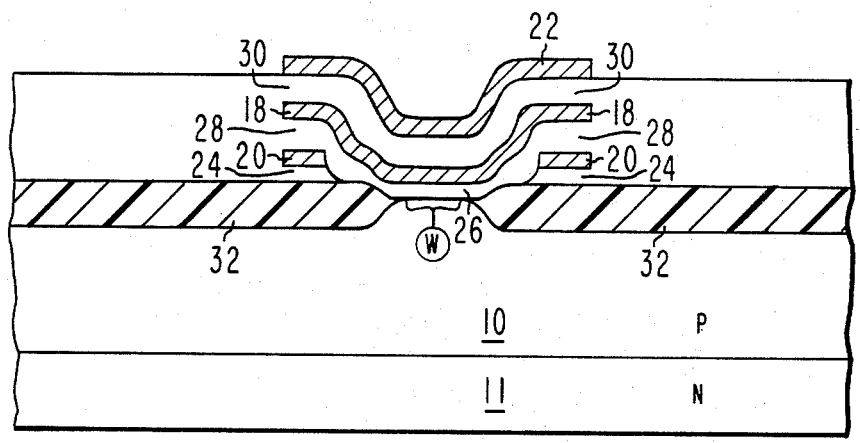
FIG. 3 is a cross-sectional, elevation view of our novel memory device taken along line 3—3 of FIG. 1.

Referring now to FIGS. 1, 2 and 3 there is shown a P well 10 formed in an N type substrate 11 with P well 10 having oppositely doped source and drain regions 14 and 12 respectively, separated by channel region 15. At the surface of P well 10 are field oxide regions 32 which define the limits of the active regions consisting of source line 14, drain line 12 and channel region 15. Above the channel region 15, and oriented in a direction generally parallel thereto, is the first level polysilicon layer 20, representing a word line or control gate, having an aperture 16 therein. First level polysilicon layer 20 is separated and insulated from the surface of P well 10 by means of insulator layer 24 having a thickness of about 500 Angstroms. A second level polysilicon layer 18 (the floating gate) is positioned above and generally parallel to first polysilicon layer 20 and is shown having a portion thereof extending through aperture 16. Layer 18 is insulated from channel region 15 by means of insulating oxide layer 26 which is thinner than insulating layer 24. The need for the insulator 26 to be thinner than insulating layer 24 will be discussed later. The area of coupling of the second level polysilicon layer 18 to the substrate is designated by "W" which, together with aperture 16, is referred to as the write window. The remainder of second level polysilicon layer 18 (floating gate) is insulated from the first level polysilicon layer 20 (word line/control gate) by means of insulating layer 28 having a nominal thickness of about 400 Angstroms.

Finally, a third level polysilicon layer 22 may be formed over floating gate 18 and is electrically connected (not shown) to first level polysilicon layer 20. The third level polysilicon layer 22 is insulated from second level polysilicon layer 18 (floating gate) by an insulating layer 30 which may have a thickness of about 300 Angstroms.

Referring again to FIGS. 1, 2 and 3 it should now be observed that, to obtain optimum tunneling it is important to maintain as much of the applied field as possible between the floating gate 18 and the substrate, as represented by P well 10. Accordingly, the floating gate (18)-to-channel (P well 10), capacitance must be reduced while the word line/control gate (20-22)-to-floating gate (18) capacitance must be increased to as large a value as possible. However, the floating gate (18)-to-channel (P well 10) capacitance is governed by the thickness of the oxide layer 26 under window 16. This oxide thickness should not be increased much above a thickness of about 120 Angstroms as this would tend to decrease current density which would then require higher fields or longer times to charge the device. Thus, this thickness represents an upper limit and will be determined by tunneling requirements. Since, therefore, the tunneling oxide cannot be made thicker we have chosen to make the interpolysilicon (polysilicon-to-polysilicon) capacitance much larger than the polysilicon-to-substrate capacitance by providing a minimum area tunneling section in combination with the large polysilicon word line/control gate (20-22)-to-floating gate (18) area. This structure permits area ratios of up to 80:1 resulting in capacitance ratios of over 10:1.

As previously stated, the premise of the subject application resides in the reversal of the positions of the word line/control gate 20 (now first level polysilicon layer) and the floating gate 18 (now the second layer polysilicon). Thus, the second level polysilicon layer 18 (floating gate)-to-P well 10 capacitance is greatly reduced. In fact, this capacitance has been reduced to the point where it is almost negligible due to the presence of the intervening first level polysilicon layer 20 under the second level polysilicon floating gate 18 except for the critical area, namely: that portion of floating gate 18 that couples to channel portion W through aperture 16 (the write window). Thus, when charge is placed on floating gate 18, the threshold level of the device has been determined.

The following table shows the nominal potentials applied to the various elements of our device in order to perform the "erase", "erase", (inhibit erase), "write", "write" (inhibit write) and "read". In the table, the various potentials shown in each of the columns are applied to the elements shown in the columns entitled "ELEMENT."

| ELEMENT | READ | WRITE | WRITE | ERASE | ERASE |
| --- | --- | --- | --- | --- | --- |
| Source (14) | 0 V | 0 V | 20 V | 20 V | 20 V |
| Drain (12) | 5 V | 0 V | 20 V | 20 V | 20 V |
| P well (10) | 0 V | 0 V | 0 V | 20 V | 0 V |
| Word Lines (20,22) | 5 V | 20 V | 0 or 20 V | 0 V | 0 or 20 V |

Thus, as shown in the above table, the device is initially erased by placing a 20 volt signal on drain 12, source 14 and P well 10. This initial "erase" cycle places a positive charge on floating gate 18 which puts channel region W in a low threshold (high conduction) state. However, there will be no electron flow through channel regions 15 and W unless and until the proper "read" voltages, as indicated in the above table, are applied. This provides a convenient method for checking the devices to determine that all the elements in the array are, in fact, erased. To be certain that the selected cells are erased, an erase (erase inhibit) signal of zero volts is applied to P well 10 and a signal of about 20 volts is applied to all sources 14 and drains 12. To "write", a 20 volt signal is placed on word lines 20, 22 while source 14, drain 12 and P well 10 are maintained at ground potential (zero volts). This has the effect of placing a negative charge on floating gate 18 which puts channel region W in a high threshold (low conduction state.) Under these conditions the negative charge on floating gate 18 will prevent channel region.

W from being inverted and no conduction can take place between source 14 and drain 12 during the read cycle. To be certain that only the selected cell is "written", a "write" (write inhibit) signal of about 20 volts is applied to those sources 14 and drains 12 of those devices that it is desired to remain unwritten. To "read" the device, that is, to determine whether a high or a low threshold state has been written into the given cell, a 5 volt signal is placed on drain 12 and word lines 20, 22 while source 14 and P well 10 are maintained at ground potential. The indication of conduction under these circumstances, will thus signify the presence of a low threshold state (erased) device.

Figure 4:
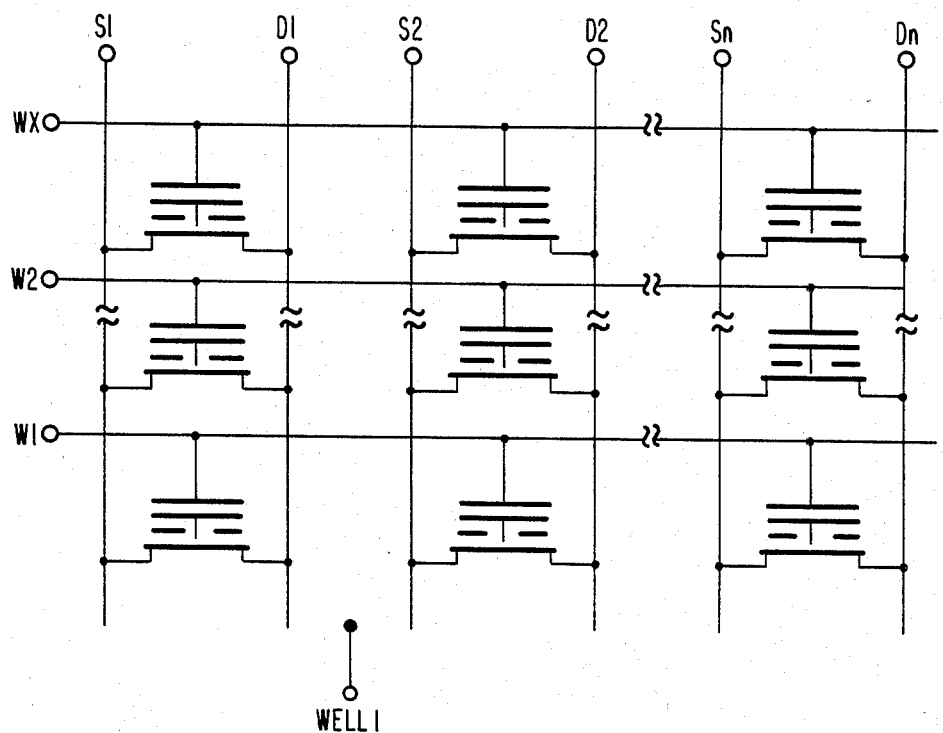
FIG. 4 is a schematic representation of an array of devices of our invention.

While we have described the operation of a single device it should be obvious to those skilled in the art that a plurality of these devices may be assembled in rows and columns to form an array. One such array is illustrated in FIG. 4 where we have shown how our novel device may be arranged in a single well. In this FIGURE, the lines labelled S1 and D1 denote the common source and drain lines (14 and 12) shared by all the devices in the first column, while S2-D2 through Sn-Dn denote the remaining columns and their respective shared sources and drains. W1, W2-Wx indicate the common word lines (20,22) in each row. Thus, to form a 1024-bit array, one would form eight columns (S1-D1 through S8-D8) with one hundred twenty-eight devices connected to word lines W1-W128. If, for example, one were desirous of assembling a 16 thousand (2K × 8) bit array, one would first form 16 P wells each of which would have 8 of these devices in a row and 128 rows high. Thus, each P well would have 1024 of these devices and the array would contain 16,384 cells. Each of the 128 devices in a column in a given P well would share the same source and drain lines 14 and 12 while each of the devices in the same horizontal row of all wells would share common word lines 20, 22. However, each device would have its own floating gate member 18. Accordingly, by appropriately biasing the source and drain lines 14 and 12 as well as P wells 10 as shown in the above table, one could very easily "write", or "read" any one of the 16 thousand devices present and "erase" all of the devices in a given row in a given well.

While we have chosen to describe our device in terms of multiple layers of polysilicon (polysilicon silicon), we do not wish to be so limited. It should now be obvious to those skilled in the art that various other conductive layers such as refractory metals, refractory metal silicides etc, or any combination thereof may be used in place of polysilicon layers 18, 20 and 22. Further while we have chosen to increase capacitance by adding layer 22, there are circumstances where this layer may not be required.

The following process sequence is one example of the manner in which our device may be fabricated:

1. Mask to define active region in well 10 which includes source region 14, drain region 12 and channel region 15;
2. Grow field oxide 32 to a thickness of about 15 thousand Angstroms in unmasked portion;
3. Remove mask;
4. Form drain and source regions 12 and 14;
5. Grow channel oxide layer 24 to a thickness of about 5 hundred Angstroms;
6. Deposit and define first level N doped polysilicon layer 20 including the defining of aperture 16;
7. Etch the portion of channel oxide layer 24 exposed under aperture 16 down to channel region W, (using polysilicon layer 18 as a mask) and limiting etch to avoid excessive loss of thickness of field oxide 32;
8. Grow window oxide layer 26, adjusting temperature and ambient to simultaneously form about 100 Angstroms of oxide layer 26 on channel W under aperture 16 and about 400 Angstroms of oxide layer 28 on N doped polysilicon layer 20;
9. Deposit and define doped floating gate 18; and
10. Standard processing procedures continue from this point and includes the formation of oxide layer 30, the formation of the third level doped polysilicon layer 22 (if desired), the formation of contacts to the various layers and well regions, metallization and etc.

What we claim is:

1. In a floating gate memory device including a body of semiconductor material of a first conductivity type having first and second doped regions of a second conductivity type formed in the semiconductor body at the surface thereof, the first and second doped regions spaced one from the other to define a channel region therebetween in the semiconductor body for supporting current flow between the doped regions, a first level conductive layer insulated from the body of the semiconductor material and a second level conductive layer positioned over both the channel region and the first conductive layer and insulated therefrom, the improvement comprising:

the first level conductive layer is a word line having a charging window formed therein aligned with the channel region and insulated from the body of semiconductor material by a layer of insulator material of a first thickness;

the second level conductive layer is a floating gate having a portion that extends through the charging window for coupling to the channel region and having a remaining portion that extends over the word line;

the portion of the floating gate that extends into the charging window is insulated from the channel region by a layer of insulator material of a second thickness; and the portion of the floating gate that extends over the word line is insulated from the word line by a layer of insulator material of a third thickness that is thicker than the second thickness and thinner than the first thickness.

2. The floating gate memory device of claim 1, wherein:

the word line is insulated from the semiconductor body by the first thickness insulator layer which is silicon oxide of about 500 Angstroms;

the floating gate is insulated from the channel region by the second thickness insulator layer which is silicon oxide of about 100 Angstroms; and the remaining portion of the floating gate is insulated from the first conductive word line by the third thickness insulator layer which is silicon oxide of about 400 Angstroms.

3. The floating gate memory device of claim 2, wherein:

the body of semiconductor material is a well region of the first conductivity type formed in a substrate of the second conductivity type;

whereby when a voltage of a first value is applied to the drain, source and well regions and 0 (zero) volts is applied to the first conductive layer, the memory device is erased to a low threshold, high conduction state; and when the drain, the source and the well regions have 0 (zero) volts applied thereto and the word line has the voltage of the first value applied, the memory device is written to a high threshold, low conduction state.

4. The floating gate memory device of claim 3, further comprising:

a plurality of devices arranged in rows and columns in a single well region;

each device in a given column sharing a common source region and a common drain region; and each device in a given row sharing a common first conductive layer.

5. The floating gate memory device of claim 4, further comprising:

a plurality of well regions;

the plurality of devices in each of the well regions are arranged in rows and columns;

each device in a given row in all of the well regions sharing a common first conductive layer; and each device in a given column of a given well region sharing a common source region and a common drain region;

whereby when a voltage of a first value is applied to the well region and to each of the plurality of drain and source regions and 0 (zero) volts is applied to each of the plurality of first conductive layers, all such memory devices are erased to a low threshold, high conduction state; and when a selected drain region, and a corresponding source region formed in a given well all have 0 (zero) volts applied thereto and the first conductive layer of a given row has the voltage of the first value applied thereto the selected memory device is written to a high threshold, low conduction state.

6. The floating gate memory of claim 1, further comprising:

a third conductive layer extending over both the first and second conductive layers; and the third conductive layer insulated from the second layer and electrically connected to the first layer.

7. The floating gate memory device of claim 6, wherein:

the first and third conductive layers are word lines electrically connected to each other; and the second conductive layer is the floating gate.

8. The floating gate memory device of claim 7, wherein:

the body of semiconductor material is a well region of the first conductivity type formed in a substrate of the second conductivity type;

whereby when a voltage of a first value is applied to the drain, source and well regions and 0 (zero) volts is applied to the word lines, the memory device is erased to a low threshold, high conduction state; and when the drain, the source and the well regions have 0 (zero) volts applied thereto and the word lines have the voltage of the first value applied, the memory device is written to a high threshold, low conduction state.

9. The floating gate memory device of claim 8, further comprising:

a plurality of devices arranged in rows and columns in a single well region;

each device in a given column sharing a common source region and a common drain region; and each device in a given row sharing common word lines.

10. The floating gate memory device of claim 9, further comprising:

a plurality of well regions;

the plurality of devices are arranged in rows and columns in each of the well regions;

each device in a given row in all of the well regions sharing common word lines; and each device in a given column of a given well region sharing a common source region and a common drain region;

whereby when a voltage of a first value is applied to a given well region and to each of the plurality of drain and source regions in the given well, and 0 (zero) volts is applied to each of the plurality of word lines, all such memory devices are erased to a low threshold, high conduction state; and when a selected drain region, and a corresponding source region formed in a given well all have 0 (zero) volts applied thereto and the word lines of a given row have the voltage of the first value applied thereto the selected memory device is written to a high threshold, low conduction state.

* * * * *

UNITED STATES PATENT AND TRADEMARK OFFICE
CERTIFICATE OF CORRECTION

PATENT NO. : 4,513,397
DATED : April 23, 1985
INVENTOR(S): Alfred Charles Ipri et al.

It is certified that error appears in the above-identified patent and that said Letters Patent is hereby corrected as shown below:

Column 4, line 33, "WRITE" (second occurrence) should be --$\overline{\text{WRITE}}$--.

Column 4, line 33, "ERASE" (second occurrence) should be --$\overline{\text{ERASE}}$--.

Signed and Sealed this

Twenty-seventh Day of August 1985

[SEAL]

Attest:

DONALD J. QUIGG

Attesting Officer Acting Commissioner of Patents and Trademarks